United States Patent
Mizukoshi et al.

(10) Patent No.: US 7,402,461 B2
(45) Date of Patent: Jul. 22, 2008

(54) METHOD OF CONNECTING BASE MATERIALS

(75) Inventors: Masataka Mizukoshi, Kawasaki (JP); Nobuhiro Imaizumi, Kawasaki (JP); Taiji Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 381 days.

(21) Appl. No.: 11/019,157

(22) Filed: Dec. 23, 2004

(65) Prior Publication Data
US 2005/0227474 A1 Oct. 13, 2005

(30) Foreign Application Priority Data
Mar. 31, 2004 (JP) ............... 2004-105529

(51) Int. Cl.
*H01L 21/44* (2006.01)
(52) U.S. Cl. ..................................... 438/108
(58) Field of Classification Search ............... 438/108, 438/110, 458, 667; 257/774, 778, E21.583, 257/E23.011, E25.013
See application file for complete search history.

(56) References Cited

U.S. PATENT DOCUMENTS

| | | | | |
|---|---|---|---|---|
| 6,482,677 B2 * | 11/2002 | Sato et al. | ............... | 438/109 |
| 6,498,053 B2 * | 12/2002 | Mastromatteo et al. | ..... | 438/107 |
| 6,673,651 B2 * | 1/2004 | Ohuchi et al. | ............... | 438/107 |
| 6,677,674 B2 * | 1/2004 | Nagao | ............... | 257/724 |
| 6,936,913 B2 * | 8/2005 | Akerling et al. | ............... | 257/686 |
| 6,975,036 B2 * | 12/2005 | Ohuchi | ............... | 257/778 |
| 7,129,110 B1 * | 10/2006 | Shibata | ............... | 438/106 |
| 2004/0222508 A1 * | 11/2004 | Aoyagi | ............... | 257/686 |

OTHER PUBLICATIONS

Patent Abstract of Japan 2001-244300, Sep. 7, 2001.
Patent Abstract of Japan 08-264706, Oct. 11, 1996.
Patent Abstract of Japan 2001-298146, Oct. 26, 2001.
Patent Abstract of Japan 2001-036250, Feb. 9, 2001.
Patent Abstract of Japan 11-274241, Oct. 8, 1999.
Patent Abstract of Japan 2003-258034, Sep. 12, 2003.
Patent Abstract of Japan 2002-252245, Sep. 9, 2002.

* cited by examiner

*Primary Examiner*—Thao P. Le
(74) *Attorney, Agent, or Firm*—Westerman, Hattori, Daniels & Adrian, LLP.

(57) ABSTRACT

The present invention is aimed at providing a method of connecting base materials capable of forming metal terminals having a uniform height and smooth surface with a low cost, and of realizing a low-damage mounting, in which a work is planarized while keeping the temperature of the insulating film, possibly elevated due to frictional heat generated during cutting using a cutting tool, lower than 80° C., and keeping the temperature range lower than 80° C. throughout the entire period of the cutting, the electrodes and electrodes are opposed and brought into contact at a temperature of 80° C. or above but lower than the curing temperature of the insulating film, the insulating film is liquefied and a space between the electrodes and electrodes is filled with an insulating resin composing the insulating film, and the insulating resin is cured at the curing temperature or above.

12 Claims, 13 Drawing Sheets
(5 of 13 Drawing Sheet(s) Filed in Color)

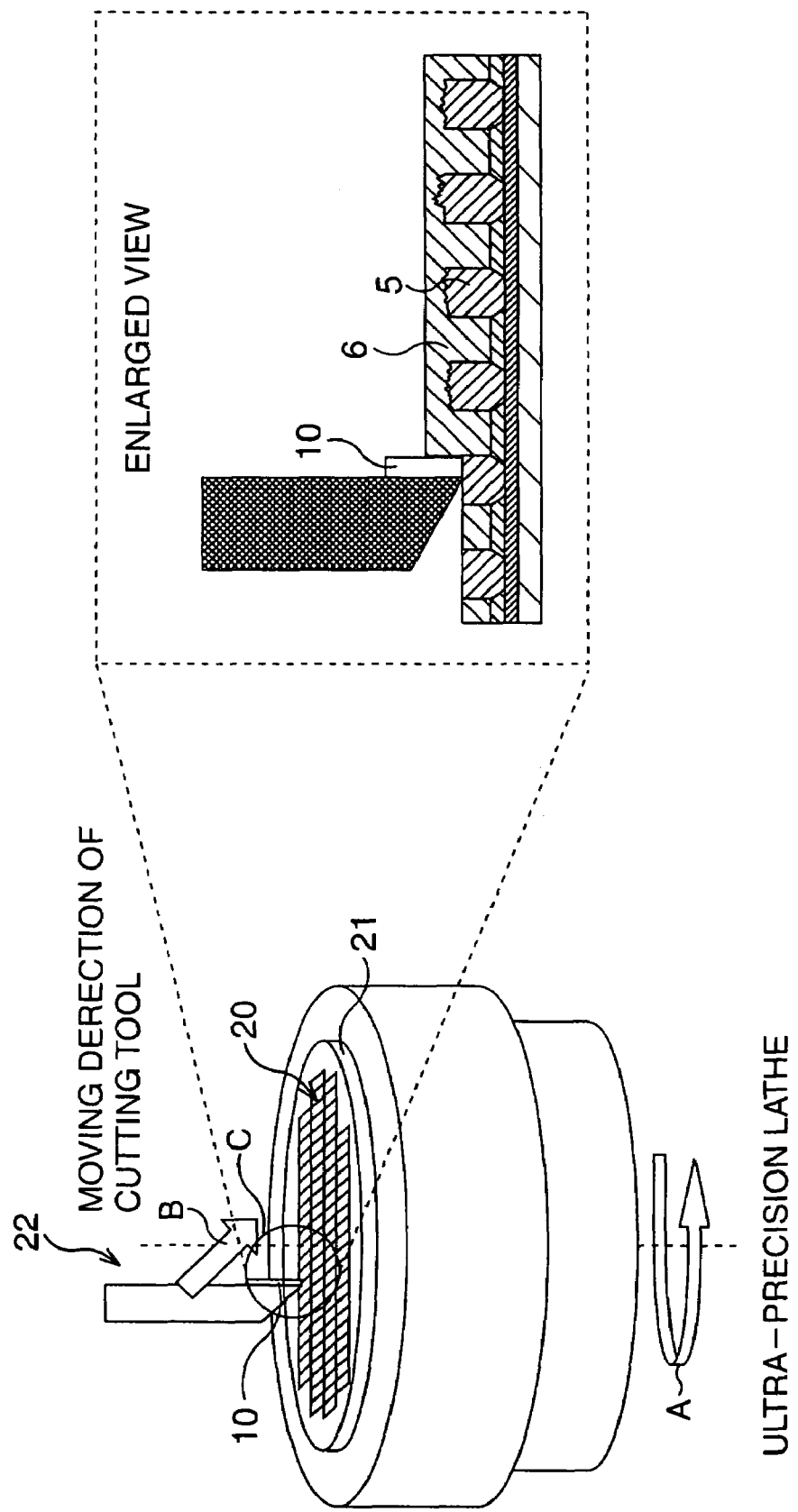

FIG. 12A
PLANARIZED BY CUTTING
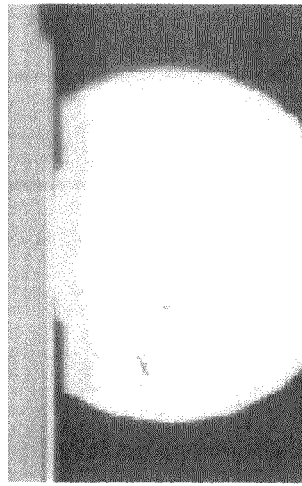 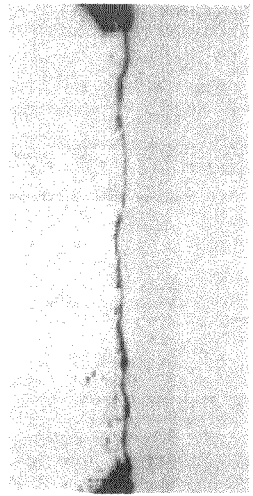
FIG. 12B
NOT PLANARIZED BY CUTTING
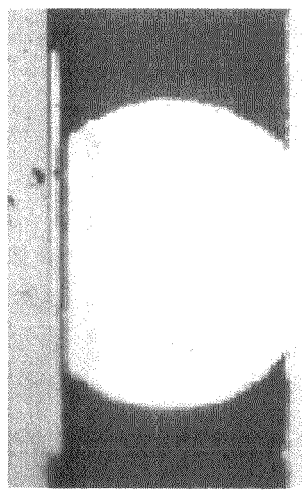 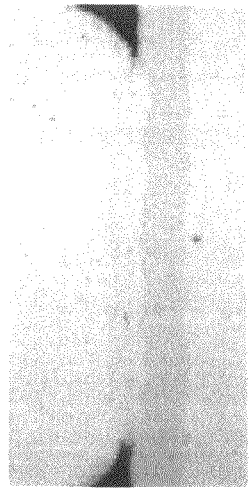

FIG. 13A
BUMPS PLANARIZED BY POLISHING
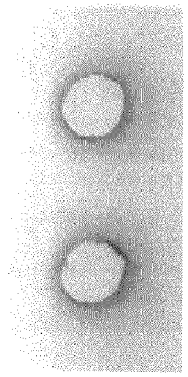
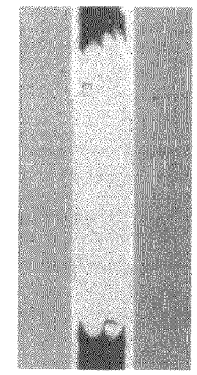
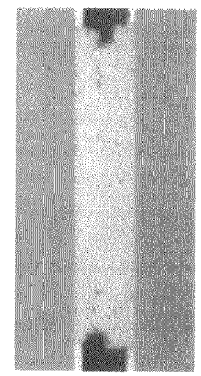
FIG. 13B
BUMPS PLANARIZED BY CUTTING
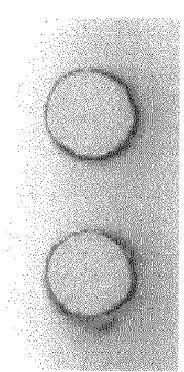
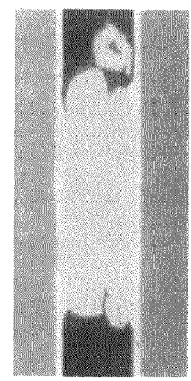
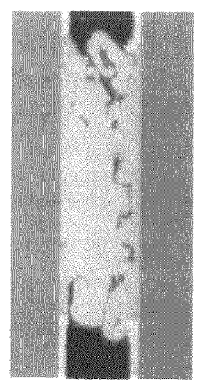
SURFACE AS PLANARIZED
ELECTRODES AS BONDED
AFTER 96 HOURS AT 105°C

METHOD OF CONNECTING BASE MATERIALS

CROSS-REFERENCE TO RELATED APPLICATIONS

This application is based upon and claims priority of Japanese Patent Application No. 2004-105529, filed on Mar. 31, 2004, the entire contents of which are incorporated herein by reference.

BACKGROUND OF THE INVENTION

1. Field of the Invention

The present invention relates to a method of connecting base materials in which a pair of base materials (combination of a circuit board and a semiconductor chip, combination of a semiconductor chip and a semiconductor chip, etc.) are connected via electrodes.

2. Description of the Related Art

There is a growing demand for high-density mounting of electronic components with recent progress in down-sizing and thinning of electronic instruments, wherein flip chip bonding has been adopted, by which electronic components such as semiconductor chips in a uncovered form are directly mounted on a substrate. Electrodes of semiconductor chips used for the flip chip bonding have bump electrodes formed thereon, and the bump electrodes and wirings on a circuit board are electrically connected.

Representative methods of forming metal terminals include electroplating process, electroless plating process, solder dipping process and solder printing process.

In the electroplating process, a work is placed in a plating solution, and the metal terminals are formed en bloc on electrode pads patterned by a photolithographic process, while supplying current through seed electrodes connected to the electrode pads. The process is characterized in that use of a high-resolution photoresist makes it possible to form the metal terminals having a large aspect ratio in several micrometers to several tens of micrometers pitch. Materials available for forming the metal electrodes by the electroplating process include gold, solder and so forth.

The electroless plating process makes it possible to form the electrode pads en bloc on arbitrary electrode pads. The process is characterized in causing anisotropic growth of a plated film, and disusing the photolithographic process.

In the solder dipping process, a work having electrode pads formed thereon is dipped in and pulled up from a molten low-melting-point metal mainly composed of Sn and Pb, so as to allow the low-melting point metal to wet on the electrode pads with the aid of the surface tension, and then to cool and solidify thereon so as to form the metal terminals.

In the solder printing process, a low-melting-point metal mainly composed of Sn and Pb in a paste form is coated by printing to recessed portions preliminarily formed on a metal plate so as to correspond with position of the electrode pads, the metal is allowed to re-flow so as to form spherical electrodes, and the spherical electrodes are then transferred en bloc onto the electrode pads on a work.

On the other hand, there are known various bonding methods of electronic components such as LSI, which include diffusion bonding using a molten solder, solid phase bonding of metals, and bump-to-bump bonding via an insulating adhesive film. All of these methods effect bonding while applying some stress, such as load, heat or ultrasonic wave to the bumps.

There is also a recent trial in which the surface of a semiconductor chip having the above-described metal terminals formed thereon is covered with an insulating resin having adhesiveness, the chip is placed on a circuit board so as to oppose the metal terminals of the both, and the insulating resin is then allowed to cure to thereby bond the metal terminals.

[Patent Document 1] Japanese Patent Application Laid-Open No. Hei 11-274241
[Patent Document 1] Japanese Patent Application Laid-Open No. 2001-298146
[Patent Document 1] Japanese Patent Application Laid-Open No. 2003-258034
[Patent Document 1] Japanese Patent Application Laid-Open No. 2002-252245

The above-described conventional processes, however, raised the problems as described below, when applied to formation of the metal terminals of electronic components such as LSI, and to mounting of these components.

The electroplating process needs a mask used for patterning, a photolithographic process, formation and removal processes of the seed electrodes, and is causative of a large increase in the process cost.

The electroless plating and solder dipping processes are causative of non-uniformity in height of the metal terminals as large as several micrometers to several tens of micrometers depending on geometry and area of the electrode pads, presence or absence of connection to a wiring pattern, and non-uniformity in conditions of the plating or dipping.

The solder printing process encounters limitation in micronization of the metal terminals because a paste is printed using a squeegee.

The method of covering the metal terminals with an insulating resin raises a problem in that the resin which remains between the metal terminals undesirably elevate electric resistance.

In the mounting of LSI components, a certain amount of external energies such as load and heat are required due non-uniformity in the height, and this inevitably results in some damage on the mounted LSI components.

It is therefore an object of the present invention, aimed at solving the above-described problems, to provide a method of connecting base materials capable of forming the metal terminals with uniform height and smooth surface at low costs, and of realizing low-damage mounting.

SUMMARY OF THE INVENTION

A method of connecting base materials of the present invention comprises the steps of forming an insulating film on a first base material having a plurality of first electrodes formed on the surface thereof, so as to bury the first electrodes using an insulating material which exhibits adhesive property at a first temperature or above; planarizing the surface of the first electrode and the surface of the insulating film so as to produce a continuous flat surface, by cutting using a cutting tool, while keeping temperature of the insulating film lower than the first temperature; and opposing the first base material to a second base material having a plurality of second electrodes formed on the surface thereof so as to bring the first electrodes and the second electrodes into contact to thereby connect the first base material and the second base material via the insulating film, and to thereby produce a solid phase diffusion layer of metals between the first electrodes and the second electrodes.

According to one aspect of the method of connecting base materials of the present invention, there is provided a process in which in the cutting is carried out while keeping the temperature of the insulating film, possibly elevated due to frictional heat generated during the cutting, lower than the first temperature.

The present invention makes it possible to form metal terminals having a uniform height and smooth surface with a low cost, to realize a low-damage mounting, and to provide a semiconductor device allowing low-damage mounting and having a high reliability.

BRIEF DESCRIPTION OF THE DRAWINGS

The patent or application file contains at least one drawing executed in color. Copies of this patent or patent application publication with color drawing(s) will be provided by the Office upon request and payment of the necessary fee

FIG. 3 is a schematic drawing of an example of a cutting machine;

FIGS. 12A and 12B are microphotographs showing results of fabrication according to experimental case 1; and FIGS. 13A and 13B are microphotographs showing results of fabrication according to experimental case 2.

DETAILED DESCRIPTION OF THE PREFERRED EMBODIMENTS

Basic Concept of the Present Invention

Figure 1A:
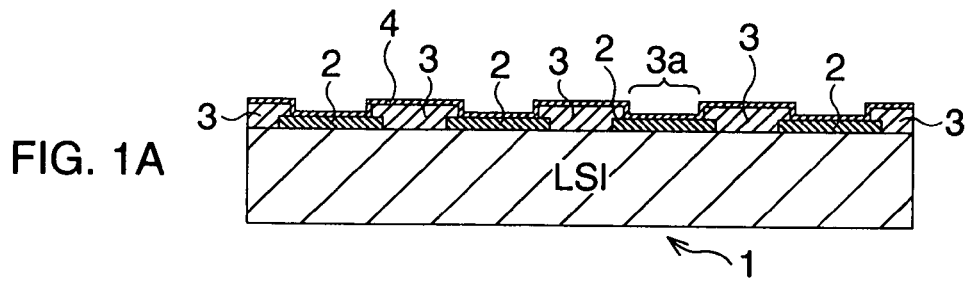
FIGS. 1A to 1E are schematic sectional views sequentially showing process steps of the method of connecting base materials according to a first embodiment.

The present invention adopts cutting using a hard cutting tool typically composed of diamond, in order to planarize en bloc a large number of electrodes formed on a base material at a low cost and with a high speed, in place of adopting the CMP process. The cutting makes it possible to continuously cut the metal and insulating film en bloc on the substrate, without being affected for example by, unlike the CMP process, polishing speed of the metal and insulating material, even for the case where the electrodes are buried in the insulting film, and to uniformly planarize the both without generating dishing or the like. For an exemplary case where gold bumps are formed by the electroplating process, the above-described planarization is made possible typically by cutting the used photoresist and electrodes en block using a cutting tool, and by removing the photoresist.

Based on the concept, the present inventors went through extensive investigations about connection of the base materials without causing increase in the number of process steps for the fabrication and complication, and a trial was made on use of an insulating material (underfill, insulating sheet, insulating film, etc.) having adhesiveness as the insulating film filling the space between the electrodes, planarization typically by cutting the surface of the first base material (surface of the electrodes and insulating film), and connection of both base materials. In other words, this process uses the insulating film as a molding material burying and protecting the electrodes, and as a connection reinforcing material when the electrodes of both base materials are connected. In this case, the insulating film is not removed after the cutting, and instead used for connecting the electrodes by virtue of its adhesiveness.

In this trial, insulating materials composing the insulating film are such as those exhibiting adhesiveness at a temperature not lower than the first temperature but losing the adhesiveness at a temperature not lower than the second temperature which is higher than the first temperature, and is more specifically such as those showing no adhesiveness in a solid form at normal temperature, but showing the adhesiveness in a liquefied form at the first temperature or above, and losing the adhesiveness by solidification at the second temperature. The present inventors confirmed that a strong connection and a desirable electric connection can successfully be obtained by a method in which planarization is carried out through cutting at a temperature lower than the first temperature, the electrodes on the first base material (diced chip, for example) and correspondent electrodes on the second base material (typically circuit board or semiconductor chip) are opposed and brought into contact at a temperature not lower than the first temperature, both base materials are connected via the insulating material possibly exhibiting adhesiveness, and the insulating material filling the space between the electrodes is then allowed to solidify at a temperature not lower than the second temperature. A problem was, however, also confirmed in that the insulating material liquefies as being affected by frictional heat caused by the cutting tool during the cutting, and that a film is undesirably formed on the surface of the electrodes.

Considering the nonconformity, the present inventors conceived to realize a further tighter connection by controlling the temperature of the insulating film, possibly elevates due to frictional heat generated during the cutting using a cutting tool, to a low level not higher than a temperature causing liquefaction of the insulating material, or the first temperature, an by allowing solid phase diffusion to proceed between the electrodes on the first base material and the electrodes on the second base material at a low temperature not higher than the melting temperature of the electrodes.

For an exemplary case of a semiconductor chip in which an epoxy resin possibly liquefies at 80° C. (the first temperature is 80° C.) is planarized by cutting using a cutting tool together with gold (Au) electrodes, it is made possible to suppress liquefaction of the epoxy resin by using a cutting tool typically composed of diamond excellent in heat conductivity, by controlling cutting speed and cutting depth of the cutting tool, and by suppressing temperature of the insulating film, possibly elevates due to the frictional heat, to as low as 80° C. or below. A tight connection using the epoxy resin and a desirable electric connection between the electrodes are successfully obtained by opposing the gold electrodes for example with tin (Sn)-plated electrodes, and by applying ultrasonic vibration under a load of as much as 10 gf per electrode typically at a temperature not lower than the second temperature, or 150° C. for example, so as to press the both for a predetermined duration of time, to thereby make close contact between Au and Sn, and also to thereby allow the peripheral epoxy resin to cure.

It is also possible to stabilize the inter-metal bonding by keeping the both base materials at a temperature not lower than the second temperature, 150° C. for example, for 30 minutes, so as to completely cure the epoxy resin, and so as to cause solid phase diffusion between Au and Sn. Because Sn has a melting point of 221° C., and an eutectic temperature of Sn and Au is 280° C., a stable and sufficient amount of alloyed layer can be formed between both metals at a relatively low temperature of 150° C. In general, solid phase diffusion is slow in growth speed of the alloyed layer as compared with fusion, and only a small bonding strength can be achieved in the initial stage of the solid phase diffusion. The present invention is aimed at reinforcing the poor bonding strength of the solid phase diffusion layer in the initial stage with the peripheral adhesive insulating film, and allowing the solid phase diffusion to completely and thoroughly proceed by heating causing complete solidification of the insulating material, so as to realize a stable connection.

The above-described bonding is made possible by selecting materials for the electrodes on the individual base materials from those causative of the solid phase diffusion. The solid phase diffusion can be proceeded at low temperature by using Au, Sn, copper (Cu), aluminum (Al), silver (Ag), nickel (Ni) or any alloy of these metals, wherein possible material combinations for the opposing electrodes include inter-metal combination such as Au/Sn, Au/Al, Sn/Ni, Sn/Cu, and alloys of these metals.

Specific Embodiments Applied with the Present Invention

The following paragraphs will detail specific embodiments applied with the present invention, referring to the attached drawings.

First Embodiment

FIGS. 1A to 1E and FIGS. 2A to 2C are schematic sectional views sequentially showing the method of connecting base materials according to a first embodiment.

Here is an exemplary case where a pair of base materials are composed of a first base material, which is a semiconductor chip diced from a semiconductor substrate, and a second base material, which is a circuit board, so that the semiconductor chip is mounted on the circuit board. In this embodiment, the surface of the semiconductor chip is planarized by the cutting, and connection is accomplished by opposing the electrodes with each other.

First, as shown in FIG. 1A, on the surface of a semiconductor substrate (not shown) having formed thereon a plurality of semiconductor chips 1 individually having predetermined semiconductor devices (MOS transistors, various semiconductor memories, etc.), electrode pads 2 are formed by patterning an Al material, for example, so as to allow external connection of the semiconductor elements. Materials composing the electrode pads 2 other than Al may be metals such as Au and Cu, for example. The electrode pads 2 are covered with an insulating film 3 typically composed of a silicon oxide film or a silicon nitride film, in which openings 3a are formed so as to expose therein the surface of the individual electrode pads 2.

An underlying film 4, composed of Ti, TiW or the like, is then formed over the entire surface of the semiconductor substrate, including the inner surface of the openings 3a and the surface of the insulating film 3. Other materials possibly composing the underlying film 4 include refractory metals such as Ti, Pd, Cr and Mo.

Figure 1B:
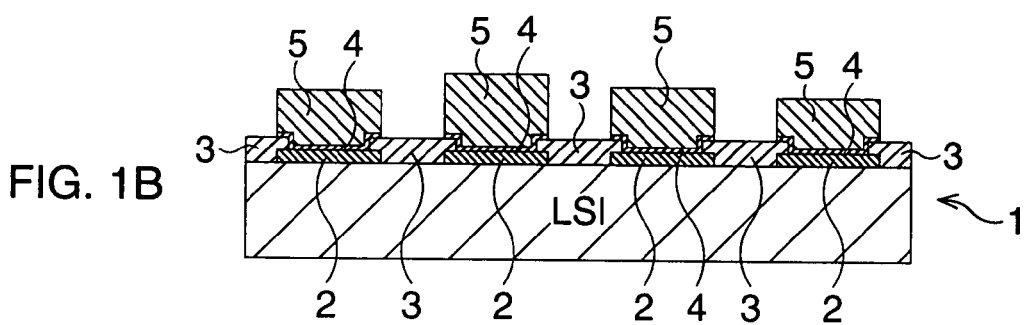

Next, as shown in FIG. 1B, electrodes 5 are patterned so as to be connected with the electrode pads 2 in the openings 3a while placing the underlying film 4 in between.

More specifically, materials composing the electrodes 5 can be selected from those capable of causing solid phase diffusion at low temperatures. Preferable examples include solders mainly composed of Au, Sn, copper (Cu), silver (Ag) or Sn. In this embodiment, a metal film is formed using Au typically by the electroplating process, and the metal film is then patterned together with the underlying layer 4, to thereby form the electrodes 5. In some cases, the individual electrodes 5 herein may be formed with non-uniform height due to conditions of formation and so forth, as shown in the drawing. The height of the individual electrodes 5 generally vary over the semiconductor chip 1 within a range of several tens of micrometers or around.

Figure 1C:
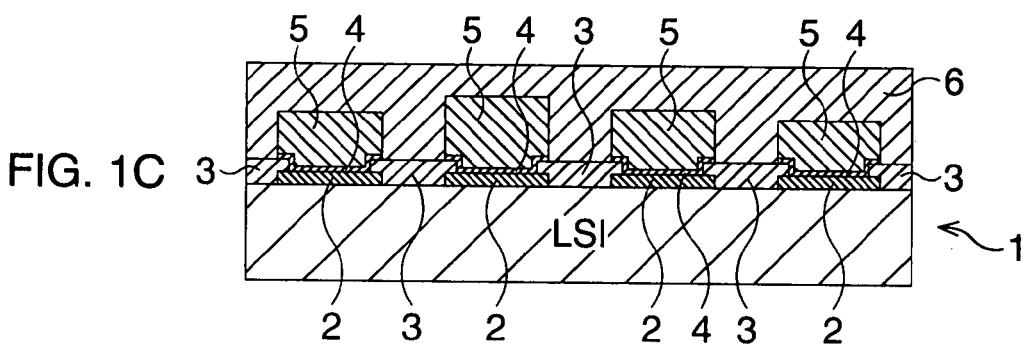

Next, as shown in FIG. 1C, an insulating film 6 is formed using an insulting material having adhesiveness, which is an insulating resin (underfill) herein, so as to cover the electrodes 5. The insulating resin is a solid at normal temperature and shows no adhesiveness, but exhibits the adhesiveness at a higher first temperature or above, and cures at a still higher second temperature or above and loses its adhesiveness. The insulating resin adopted in this embodiment is so-called, B-stage adhesive, which is an epoxy-resin-base film-type adhesive or epoxy-resin-base liquid-type adhesive, and can solidify by precuring. The first temperature in this case is 80° C.

Composition of the film-type adhesive adopted herein is such as including 25 wt % of an adhesive component (epoxy resin and phenol resin, curing aid), 50 wt % of an inorganic filler (silica or alumina filler having an average particle size of 1.5 μm and maximum particle size of 10 μm), and 25 wt % of a solvent (ether or ketone). Composition of the B-stage adhesive adopted herein is such as including 36 wt % of an adhesive component (epoxy resin and phenol resin or amine and curing aid), 10 wt % of an inorganic filler (silica or alumina filler having an average particle size of 1.5 μm and maximum particle size of 10 μm), and 10 wt % of a solvent (ether or ketone).

The film-type adhesive may be added with a plasticizer in order to keep a geometry of the produced film. Best choice of the plasticizer is polymethyl methacrylate or polyester. The amount of addition of the solvent are not limited to those described in this embodiment, and is controlled depending on species of the epoxy resin and phenol resin or amine adopted herein, or on thickness of the adhesive layer to be formed.

The epoxy resin used for this embodiment is not specifically limited so far as it is an epoxy resin, wherein, in view of improving heat resistance of the adhesive, it is preferably an epoxy resin having at least two functional groups in one molecule. This sort of epoxy resins include bisphenol A-type epoxy resin, bisphenol F-type epoxy resin, biphenyl-type epoxy resin, bisphenol S-type epoxy resin, diphenylether-type epoxy resin, dicyclopentadiene-type epoxy resin, cresol novolac-type epoxy resin, DPP novolac-type epoxy resin and naphthalene-skeleton epoxy resin.

The phenol resin used for the curing aid of the film-type adhesive is not specifically limited so far as it is a phenol resin, wherein, in view of improving heat resistance and environmental conformity of the adhesive, it is preferably a novolac-type phenol resin having at least two functional groups in one molecule. This sort of phenol resins are provided as phenol novolac, cresol novolac, naphthol-type novolac, xylylene-type novolac, dicyclopentadiene-type novolac, styrene-modified novolac and allyl-forming novolac.

The phenol resin or amine used as the curing aid for the B-stage adhesive is preferably such as causing two-stage curing reaction so as to exhibit the B-stage behavior. For this purpose, those having a steric hindrance in the molecule are preferable.

The phenolic hardener is preferably decaline-modified phenol novolac or p-hydroxybenzaldehyde-type phenol novolac, and the amine is preferably aromatic amine such as diamino diphenyl methane, diamino diphenyl sulfone and m-phenylenediamine, and some low-toxic ones having an alkyl group introduced in the individual aromatic amines. Other example of amine includes dicyan diamide.

Figure 1D:
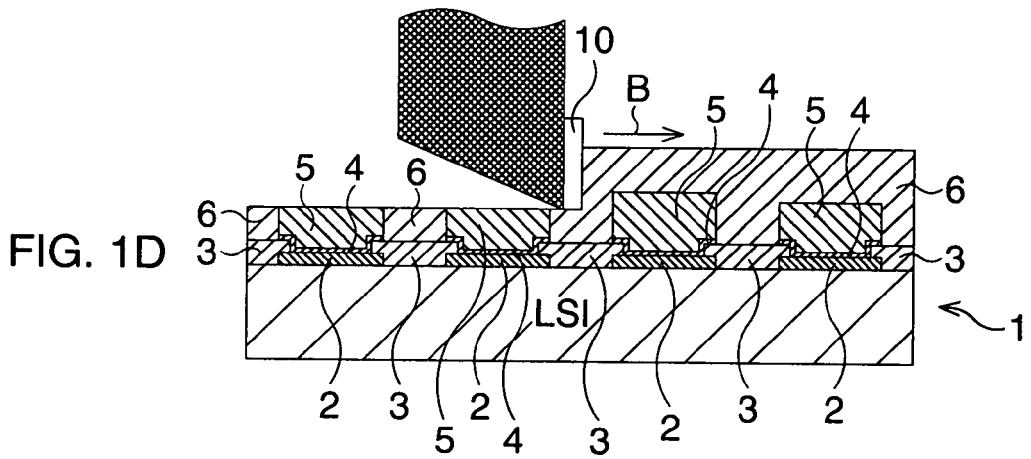
Figure 1E:
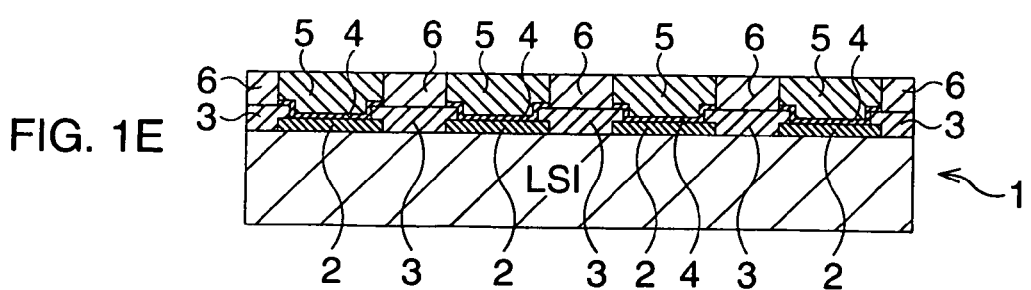

Next, as shown in FIG. 1D, cutting is conducted along, for example, in the direction of arrow B using a hard cutting tool 10 typically composed of diamond, so as to continuously planarize the surface of the electrodes 5 and the surface of the insulating film 6 on the semiconductor chip 1, to thereby planarize the work as shown in FIG. 1E. The surface planarization herein successfully makes the height of the individual electrodes 5 uniform.

An example of cutting machine is shown in FIG. 3. As shown in the drawing, this embodiment will describe a case wherein the entire surface of a semiconductor substrate having a plurality of semiconductor chips formed thereon is cut at a time before being diced into the individual semiconductor chips. It is to be noted that it is also allowable herein to dice the semiconductor substrate, having the insulating film 6 formed thereon so as to cover the electrodes 5 as shown in FIG. 1C, to thereby separate the individual semiconductor chips, and to subject each of thus-separated semiconductor chips 1 to the cutting process using the cutting machine.

The cutting machine is a so-called, ultra-precision lathe, and comprises a substrate holder (rotating table) 21 capable of holding a semiconductor substrate 20 (or diced semiconductor chip 1) placed thereon by vacuum chucking, and of rotating the semiconductor substrate 20 at a predetermined rotational speed (number of rotation of 800 rpm to 1,600 rpm or around, for example) typically in the direction of arrow A in the drawing; a hard cutting tool 10 typically composed of diamond; and a cutting section 22 moving the cutting tool 10 typically in the direction of arrow B in the drawing. Cutting is effected by bringing the cutting tool 10 into contact with the surface of the semiconductor substrate 20, and by moving the cutting tool 10 in the direction of arrow B while rotating the semiconductor substrate 20 in the direction of arrow A. The right hand side of FIG. 3 shows an enlargement of circle C, which shows a state of the cutting process almost similar to that shown in FIG. 1D. In the enlarged drawing, the electrodes 5 are illustrated as having an emphasized surface roughness.

In the cutting process in this embodiment, cutting is carried out so as to keep the solid state of the insulating film 6, without being liquefied, throughout the entire period of the process. More specifically, temperature of the semiconductor chip 1 is set lower than 80° C., which is the liquefaction temperature (first temperature) of the insulating film 6, and the planarization is proceeded while controlling temperature of the insulating film 6 possibly elevated due to frictional heat generated during the cutting process using the cutting tool 10 at a temperature lower than 80° C., and keeping a temperature range lower than 80° C. throughout the entire period of the cutting process.

This embodiment further proposes an index for process management of the cutting in order to reliably keep the solid state of the insulating film 6 during the cutting process.

Figure 4:
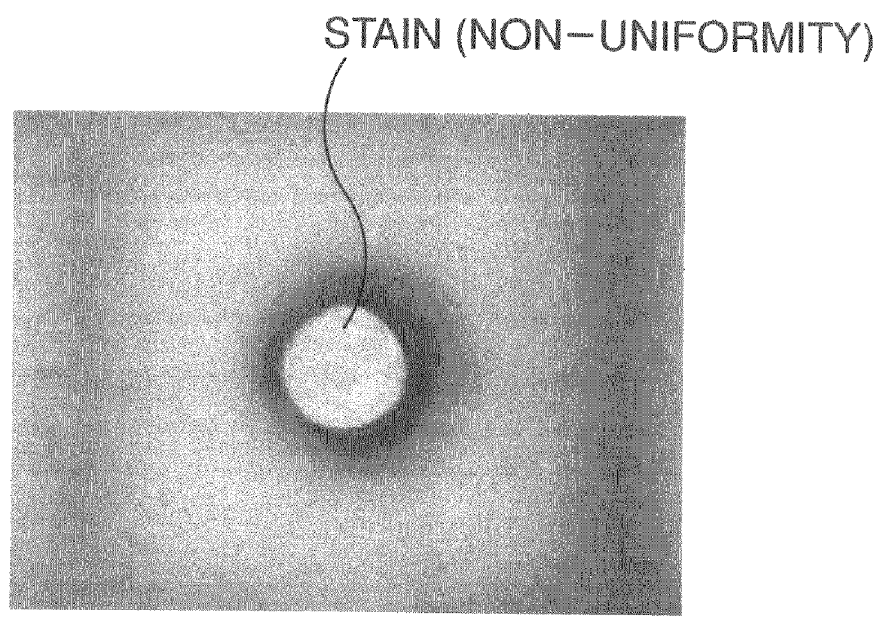
FIG. 4 is a microphotograph showing a state of an electrode surface having a light stain (non-uniformity) of an insulating resin formed thereon due to a slight amount of the insulating resin liquefied during the cutting.

FIG. 4 is a microphotograph showing a state of an electrode surface having a light stain (non-uniformity) of the insulating resin formed thereon due to a slight amount of the insulating resin liquefied during the cutting process. The situation is not so serious to be judged as a level possibly inhibiting the solid phase diffusion reaction between the electrodes, but it is necessary to suppress this state in the cutting process of this embodiment.

In the cutting process in this embodiment, conditions including cutting speed, material composing the cutting tool 10 (heat conductivity), cutting depth, rake angle, and side rake angle are adjusted and managed, in order to suppress the frictional heat possibly generated during the cutting process to a low level depending on the insulating material to be used, and to keep temperature of the insulating material lower than the first temperature, or the liquefaction temperature of the material, and it is confirmed that no stain of the insulating resin, as shown in FIG. 4, is formed on the cut surface of the metal. For example, generation of the frictional heat can be suppressed to a low level by selecting the individual conditions such as a slow cutting speed, use of a highly-heat-conductive material for the cutting tool 10, a shallow cutting depth, a large rake angle and a large side rake angle.

For an exemplary case where an epoxy-base general adhesive insulating resin is used, and the cutting toll 10 is composed of diamond, the cutting process is successful in suppressing the frictional heat and in avoiding stain of the insulating resin, by selecting a cutting speed of approximately 800 m/min or less, a cutting depth of approximately 2 μm or less, a rake angle and side rake angle of approximately 5° or more, respectively.

Table 1 describes cutting process parameters and their tendencies, effective for suppressing temperature during the cutting of the insulating material lower than the first temperature of the insulating material.

TABLE 1

| Parameter | Tendency Frictional heat small ⇔ large | | Appropriate range |
|---|---|---|---|
| Cutting speed | slow | fast | ≦800 m/min |
| Heat conductivity of cutting tool | high | low | diamond is best |
| Cutting depth | shallow | deep | ≦2 μm |
| Rake angle | large | small | ≧5° |
| Side rake angle | large | small | ≧5° |

A vast variety of insulating materials are available for the present invention, so that specific values of the parameters cannot uniquely be determined, but can be variable depending on the insulating materials.

Figure 2A:
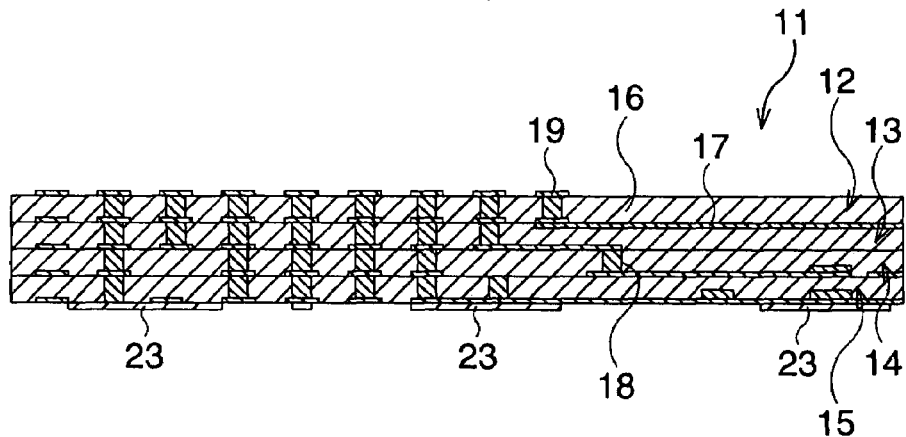
FIGS. 2A to 2C are schematic sectional views sequentially showing process steps of the method of connecting base materials according to the first embodiment, as continued from FIG. 1E.

On the other hand, a circuit board 11 is a packaged board having a plurality of, four in this drawing, wiring layers 12, 13, 14 and 15 stacked therein as shown in FIG. 2A, and each of the individual wiring layers 12 to 15 respectively has an insulating film 16 having wirings 17 and viaholes 18 used for inter-wiring connection formed therein. A plurality of electrodes 19 formed in a continuously flat manner so as to be connected with the viaholes 18 are formed on one main surface of the circuit board 11, that is, on the surface of the topmost wiring layer 12, and a plurality of connection terminals 23 formed as being connected with the viaholes 18 are formed on the other main surface the circuit board 11, that is, on the surface of the lowermost wiring layer 15. The electrodes 19 are typically composed of any one of Au, Sn and Cu.

It is to be noted that, in this embodiment, one main surface of the circuit board 11 is not always necessarily be processed by cutting, and instead proper levels of continuity and planarization of the plurality of electrodes 19 will suffice, but it is also allowable that one main surface may be planarized by the cutting process similarly to the semiconductor chip 1. In this case, the cutting process can be conducted for the circuit board 11 in a form having only the plurality of electrodes 19 formed thereon (in a form having no insulating film covering the electrodes 19).

Figure 2B:
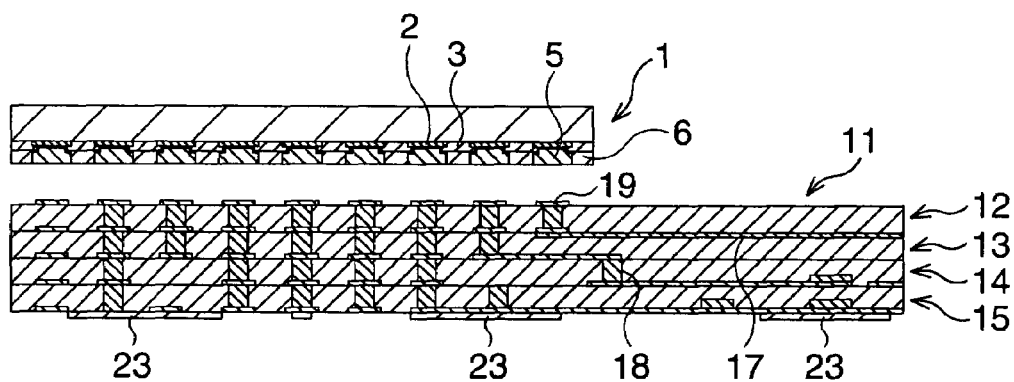
Figure 2C:
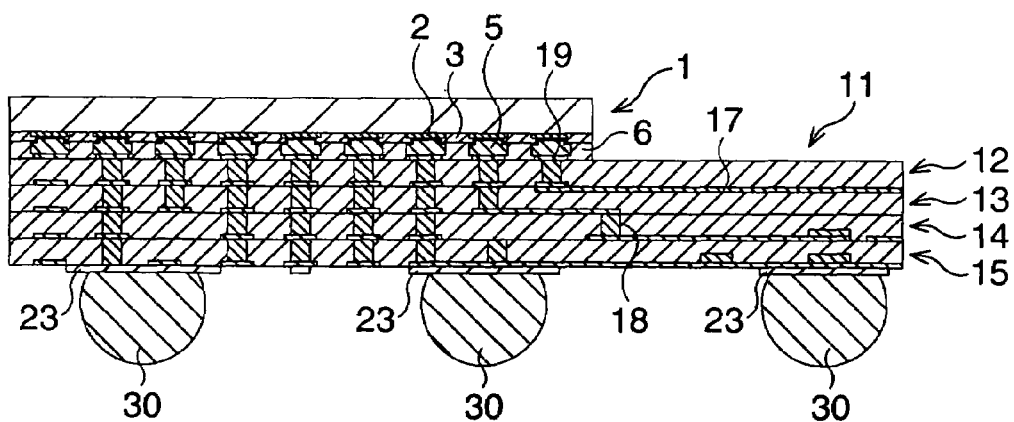

Next, the individual semiconductor chips 1 are diced from the semiconductor substrate 20 (of course this process is unnecessary for the case where the individual semiconductor chips 1 were diced before the cutting process as described in the above), and as shown in FIG. 2B, the planarized surfaces of each semiconductor chip 1 and the circuit board 11 are opposed. Then as shown in FIG. 2C, the electrodes 5 and the electrodes 19 are correspondently brought into contact, and the insulating film 6 is liquefied so that the space between the electrodes 5 and electrodes 19 is filled with the insulating material composing the insulating film 6, while keeping the semiconductor chip 1 and circuit board 11 at a temperature not lower than 80° C., which is the liquefaction temperature of the insulating film 6 (first temperature), and lower than the solidification (curing) temperature (second temperature) of the insulating film 6, an ultrasonic vibration of 10 gf per one electrode is then applied at a second temperature, typically at 150° C., and the semiconductor chip 1 is pressurized for a predetermined time period so as to make the insulating resin cure. Further keeping of the both at 150° C. for 30 minutes or around completely makes the insulating resin cure, and produces a solid phase diffusion layer between Au composing the electrodes 5 and Sn composing the electrodes 19, thereby the inter-metal bonding is stabilized. This is successful in connecting the semiconductor chip 1 and the circuit board 11 with the aid of the insulating film 6, and through inter-metal bonding ascribable to the solid phase diffusion layer formed between the electrodes 5, 19. In this process, the electrodes 5, 19 are bonded to thereby establish electrical connection, and the insulating film 6 contributes to a tight bonding by virtue of its excellent adhesiveness, and this ensures the connection between the semiconductor chip 1 and the circuit board 11.

It is to be noted that it is also allowable herein to adjust the temperature of the semiconductor chip 1 lower than 80° C., or the liquefaction temperature of the insulating film 6, to adjust the temperature of the circuit board 11 higher than 80° C., or the liquefaction temperature of the insulating film 6, and to oppose and make contact of the electrodes 5 and the electrodes 19 while keeping this state, to thereby elevate the temperature of the insulating film 6 to as high as 80° C. or above, so as to cause liquefaction of the insulating film 6.

Thereafter, solder balls 30 used for external connection are placed on the connection terminals 23 formed on the other main surface of the circuit board 11, thereby the semiconductor device is completed.

MODIFIED EXAMPLES OF THE FIRST EMBODIMENT

The paragraphs below will explain modified examples of the first embodiment. These modified examples differ from the first embodiment in configuration of the electrodes. It is to be noted that the same reference numerals will commonly be used for the constituents equivalent to those shown in the above embodiment.

Modified Example 1

The paragraphs herein will explain an exemplary case where solder bumps are formed as the electrodes connecting the semiconductor chip and the circuit board.

FIGS. 5A to 5E and FIGS. 6A to 6C are schematic sectional views sequentially showing the method of connecting base materials according to a first modified example.

Figure 5A:
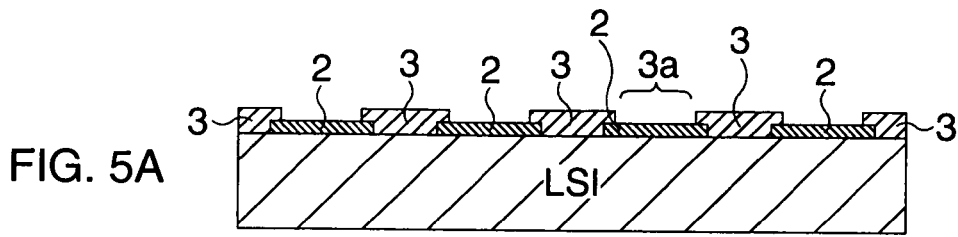
FIGS. 5A to 5E are schematic sectional views sequentially showing process steps of the method of connecting base materials according to a first modified example of the first embodiment.

First, as shown in FIG. 5A, the electrode pads 2 used for external connection of the semiconductor devices are formed on the surface of each semiconductor chip 31 similarly to as shown in FIG. 1A, the insulating film is deposited so as to bury the electrode pads 2, and the insulating film 3 is then patterned to thereby form the openings 3a which allow the surface of the individual electrode pads 2 to expose therein.

Figure 5B:
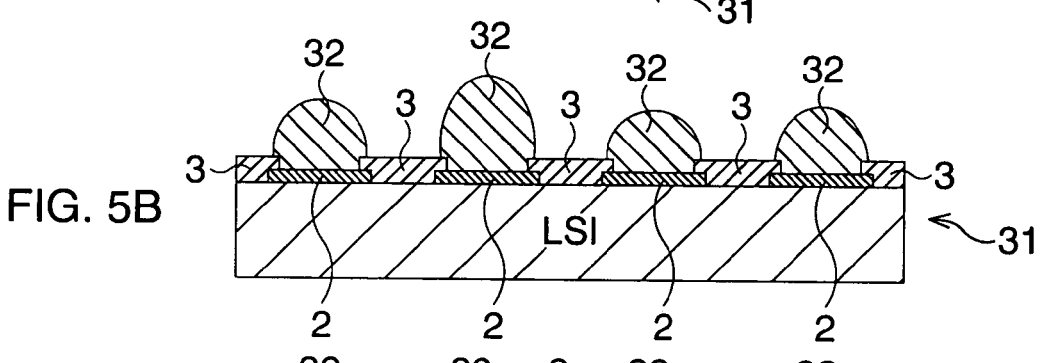

Next, as shown in FIG. 5B, electrodes 32 are formed so as to be connected with the electrode pads 2 in the openings 3a.

More specifically, a material composing the electrodes 32 used herein is a solder possibly causing solid phase diffusion at low temperatures, and solder bumps are formed as the electrodes 32. In some cases, the individual electrodes 32 herein may be formed with non-uniform height due to conditions of formation and so forth, as shown in the drawing. The height of the individual electrodes 32 generally vary over the semiconductor chip 31 within a range of several tens of micrometers or around.

Figure 5C:
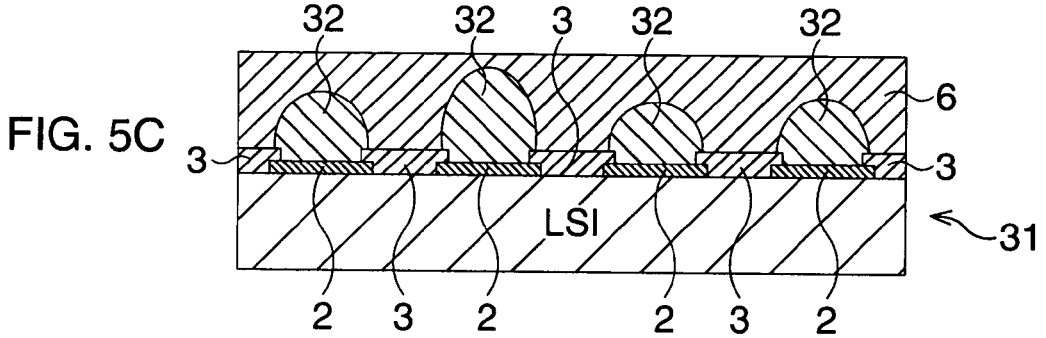

Next, as shown in FIG. 5C, the insulating film 6 is formed so as to cover the electrodes 32 similarly to as shown in FIG. 1C, using an adhesive insulating material, which is herein an insulating resin typified by a B-stage adhesive.

Figure 5D:
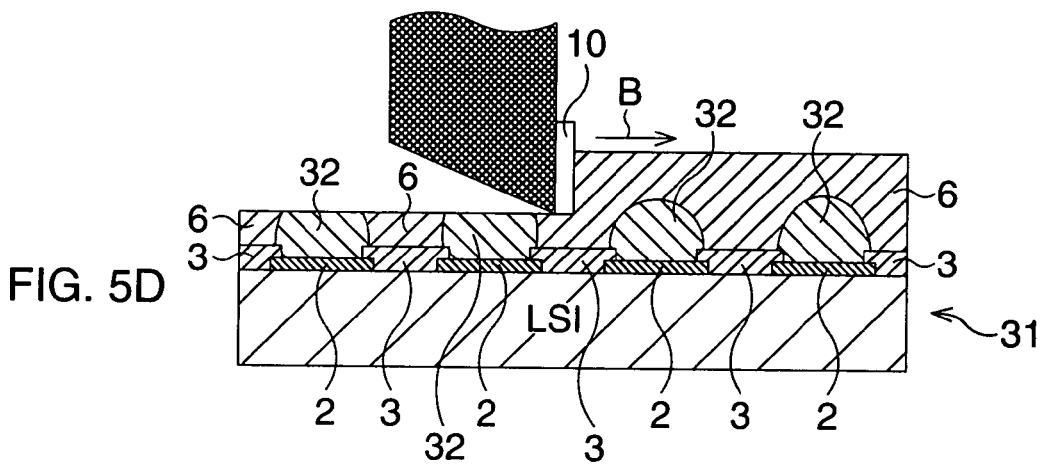
Figure 5E:
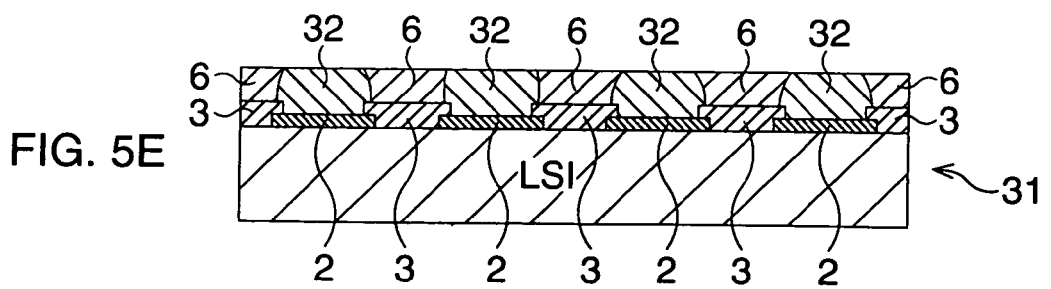

Next, as shown in FIG. 5D, cutting is conducted along, for example, in the direction of arrow B using the cutting machine shown in FIG. 3 and the hard cutting tool 10 typically composed of diamond, so as to continuously planarize the surface of the electrodes 32 and the surface of the insulating film 6 on the semiconductor chip 1, to thereby planarize the work as shown in FIG. 5E. The surface planarization herein successfully makes the height of the individual electrodes 32 uniform.

In the cutting process in modified example 1, the cutting process is conducted, similarly to as in the embodiment, so as to keep the solid state of the insulating film 6, without being liquefied, throughout the entire period of the process. More specifically, temperature of the semiconductor chip 1 is set lower than 80° C., which is the liquefaction temperature (first temperature) of the insulating film 6, and the planarization is proceeded while controlling temperature of the insulating film 6 possibly elevated due to frictional heat generated during the cutting process using the cutting tool 10 at a temperature lower than 80° C., and keeping a temperature range lower than 80° C. throughout the entire period of the cutting process.

In the cutting process in the modified example, similarly to as in the embodiment, conditions including cutting speed, material composing the cutting tool 10 (heat conductivity), cutting depth, rake angle, and side rake angle are adjusted and managed, in order to keep temperature of the insulating material lower than the first temperature, or the liquefaction temperature of the material depending on the insulating material to be used, and it is confirmed that no stain of the insulating resin is formed on the cut surface of the metal.

Figure 7A:
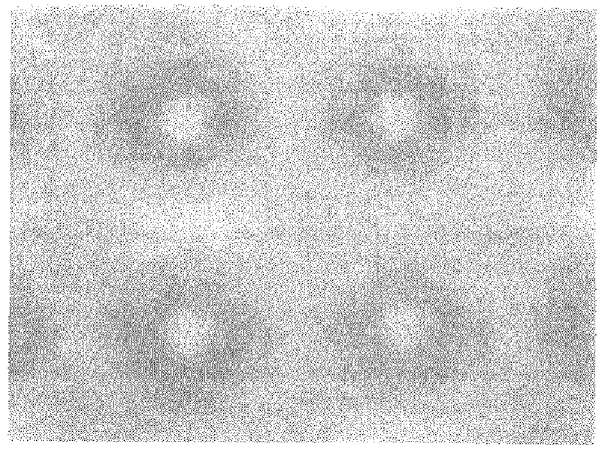
FIGS. 7A and 7B are microphotographs showing a state of an electrode surface obtained by cutting under regulation and management according to the present invention.
Figure 7B:
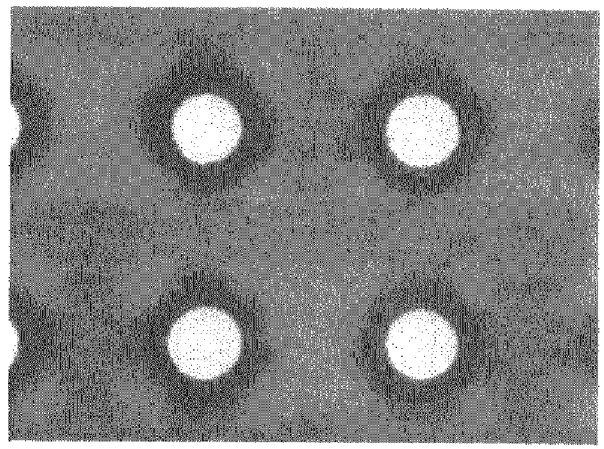

Microphotographs of the surface state of the electrodes 32 thus processed by cutting under the above-described adjustment and management are shown in FIGS. 7A and 7B. FIG. 7A shows a state of FIG. 5C, and FIG. 7B shows a state of FIG. 5D. It is found that the electrodes 32 after the cutting process of the modified example 1 shows no stain of the insulating resin formed on the surface thereof, and that the cutting process was successfully carried out without causing liquefaction of the insulating material.

Figure 6A:
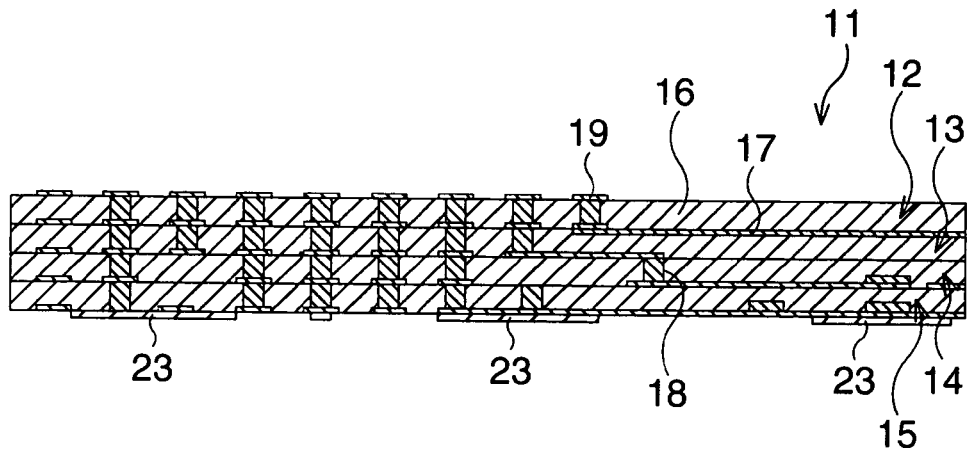
FIGS. 6A to 6C are schematic sectional views sequentially showing process steps of the method of connecting base materials according to the first modified example of the first embodiment, as continued from FIG. 5E.
Figure 6B:
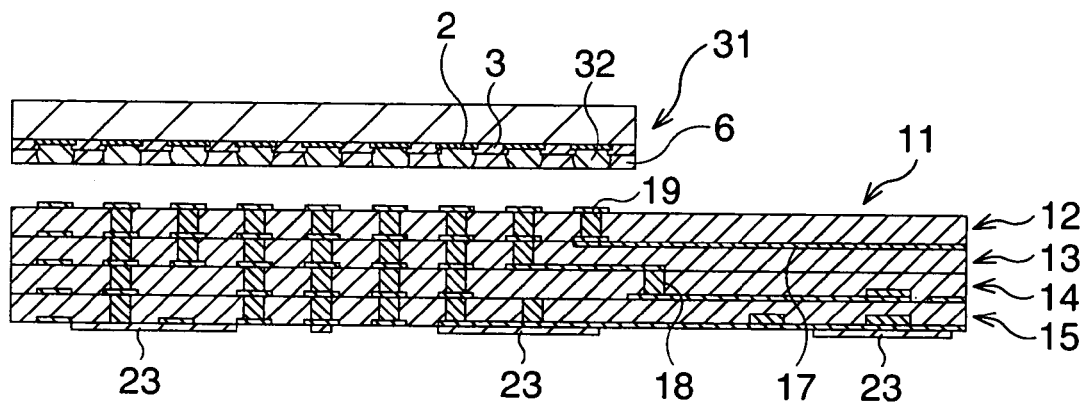
Figure 6C:
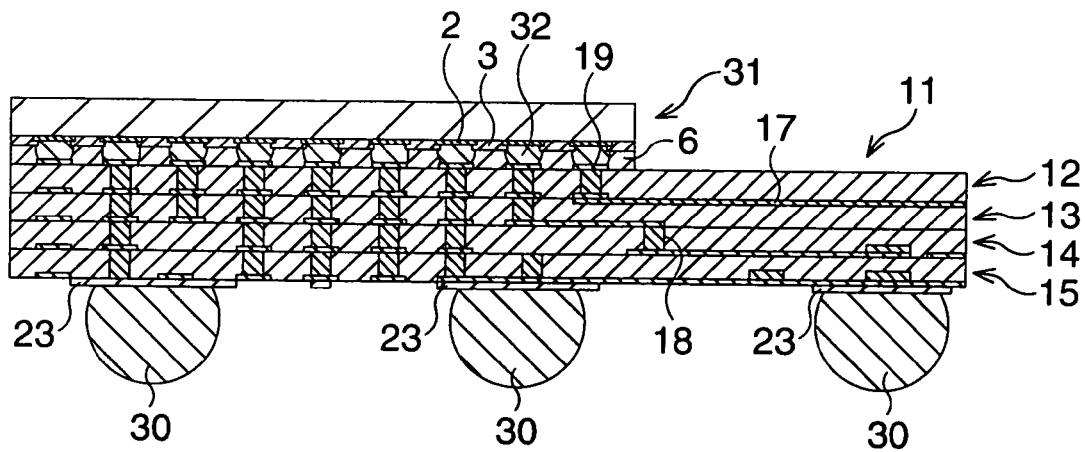

Next, the individual semiconductor chips 31 are diced from the semiconductor substrate 20 (of course this process is unnecessary for the case where the individual semiconductor chips 1 were diced before the cutting process), and as shown in FIG. 6B, the planarized surfaces of each semiconductor chip 31 and the circuit board 11 are opposed. Then as shown in FIG. 6C, the electrodes 32 and the electrodes 19 are correspondently brought into contact, and the insulating film 6 is liquefied while keeping the semiconductor chip 31 and circuit board 11 shown in FIG. 6A at a temperature not lower than 80° C., which is the liquefaction temperature of the insulating film 6 (first temperature), and lower than the solidification (curing) temperature (second temperature) of the insulating film 6. After the space between the electrodes 32 and electrodes 19 is filled with the insulating material composing the insulating film 6, an ultrasonic vibration of approximately 10 gf per one electrode is then applied at a second temperature, typically at 150° C., and the semiconductor chip 31 is pressurized for a predetermined time period. Heating for several seconds completely makes the insulating resin cure. Further keeping of the both at 150° C. for 10 minutes to 1 hour or around completely makes the insulating resin cure, and produces a solid phase diffusion layer between the solder composing the electrodes 32 and Sn or Au composing the electrodes 19, thereby the inter-metal bonding is stabilized. This is successful in connecting the semiconductor chip 31 and the circuit board 11 with the aid of the insulating film 6, and through inter-metal bonding ascribable to the solid phase diffusion layer formed between the electrodes 32, 19. In this process, the electrodes 32, 19 are bonded to thereby establish electrical connection, and the insulating film 6 contributes to a tight bonding by virtue of its excellent adhesiveness, and this ensures the connection between the semiconductor chip 31 and the circuit board 11.

Thereafter, solder balls 30 used for external connection are placed on the connection terminals 23 formed on the other main surface of the circuit board 11, thereby the semiconductor device is completed.

Modified Example 2

The paragraphs herein will explain an exemplary case where solder bumps are formed as the electrodes connecting the semiconductor chip and the circuit board.

FIGS. 8A to 8E and FIGS. 9A to 9C are schematic sectional views sequentially showing the method of connecting base materials according to a second modified example.

Figure 8A:
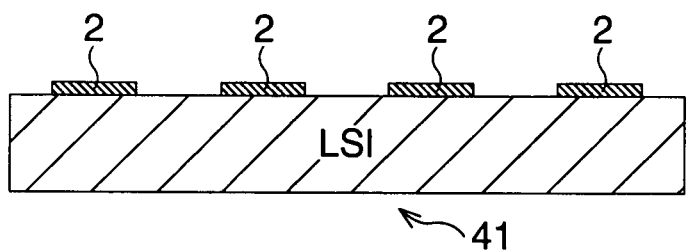
FIGS. 8A to 8E are schematic sectional views sequentially showing process steps of the method of connecting base materials according to a second modified example of the first embodiment.

First, as shown in FIG. 8A, the electrode pads 2 used for external connection of the semiconductor devices are formed on the surface of each semiconductor chip 41 similarly to as shown in FIG. 1A.

Figure 8B:
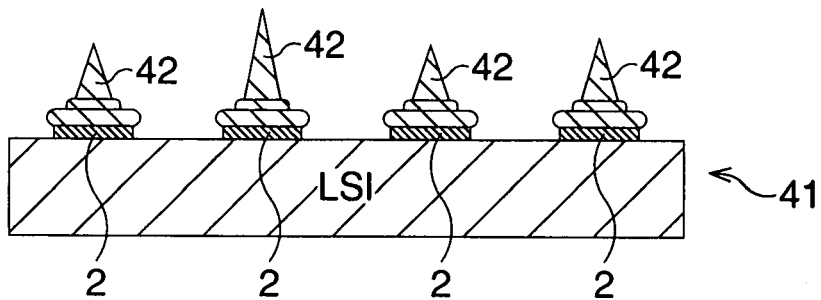

Next as shown in FIG. 8B, electrodes 42 connected to the electrode pads 2 are formed.

More specifically, a material composing the electrodes 42 used herein is Au possibly causing solid phase diffusion at low temperatures, and Au stud bumps are formed as the electrodes 42 by the stud bump process. In some cases, the individual electrodes 42 herein may be formed with non-uniform height due to conditions of formation and so forth, as shown in the drawing. The height of the individual electrodes 42 generally vary over the semiconductor chip 41 within a range of ±10 μm or around.

Figure 8C:
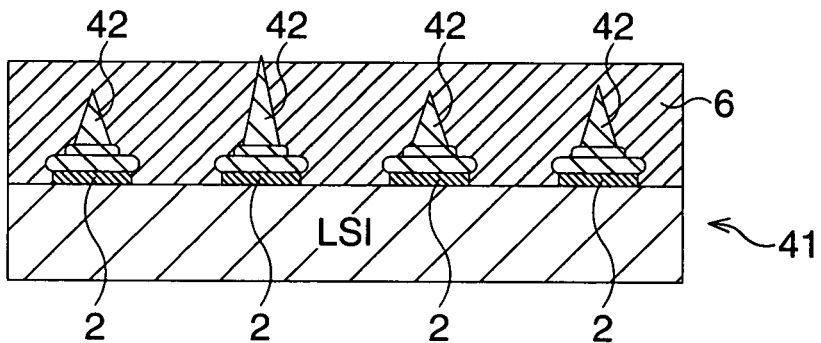

Next, as shown in FIG. 8C, the insulating film 6 is formed so as to cover the electrodes 42 similarly to as shown in FIG. 1C, using an adhesive insulating material, which is herein an insulating resin typified by a B-stage adhesive.

Figure 8D:
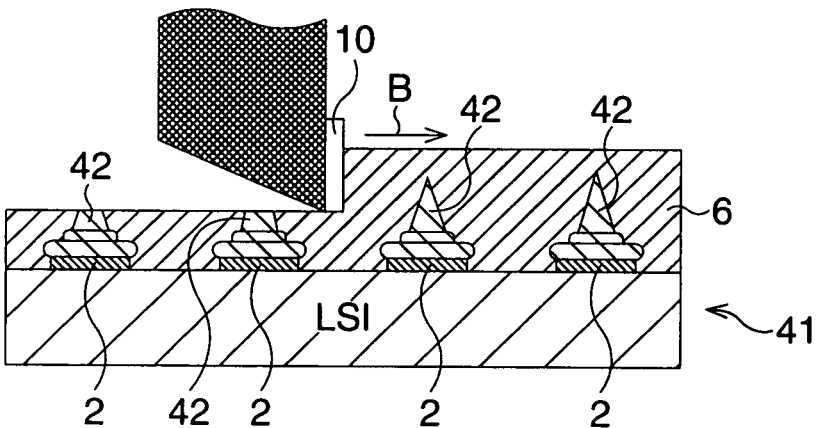
Figure 8E:
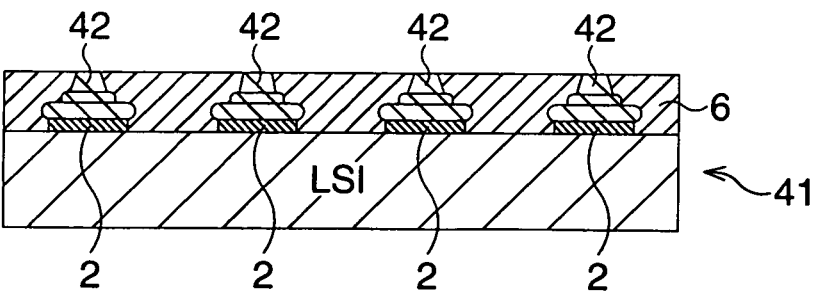

Next, as shown in FIG. 8D, cutting is conducted along, for example, in the direction of arrow B using the cutting machine shown in FIG. 3 and the hard cutting tool 10 typically composed of diamond, so as to continuously planarize the surface of the electrodes 42 and the surface of the insulating film 6 on the semiconductor chip 1, to thereby planarize the work as shown in FIG. 8E. The surface planarization herein successfully makes the height of the individual electrodes 42 uniform.

In the cutting process in modified example 2, the cutting is conducted, similarly to as in the embodiment, so as to keep the solid state of the insulating film 6, without being liquefied, throughout the entire period of the process. More specifically, temperature of the semiconductor chip 1 is set lower than 80° C., which is the liquefaction temperature (first temperature) of the insulating film 6, and the planarization is proceeded while controlling temperature of the insulating film 6, possibly elevated due to frictional heat generated during the cutting process using the cutting tool 10, at a temperature lower than 80° C., and keeping the a temperature range lower than 80° C. throughout the entire period of the cutting process.

In the cutting process in the modified example similarly to as in the embodiment, conditions including cutting speed, material composing the cutting tool 10 (heat conductivity), cutting depth, rake angle, and side rake angle are adjusted and managed, in order to keep temperature of the insulating material lower than the first temperature, or the liquefaction temperature of the material, depending on the insulating material to be used, and it is confirmed that no stain of the insulating resin is formed on the cut surface of the metal.

Figure 10A:
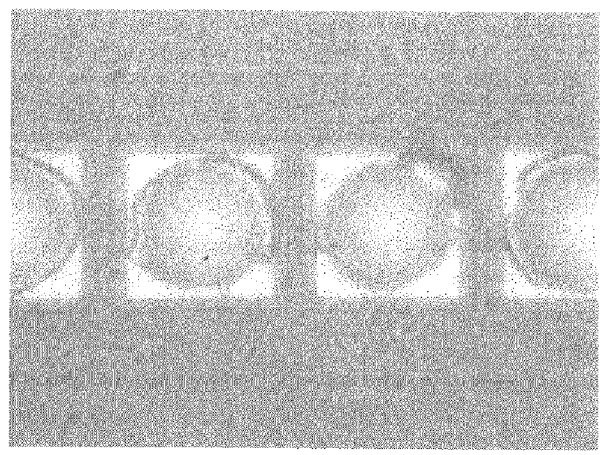
FIGS. 10A and 10B are microphotographs showing a state of an electrode surface obtained by cutting under regulation and management according to the present invention.
Figure 10B:
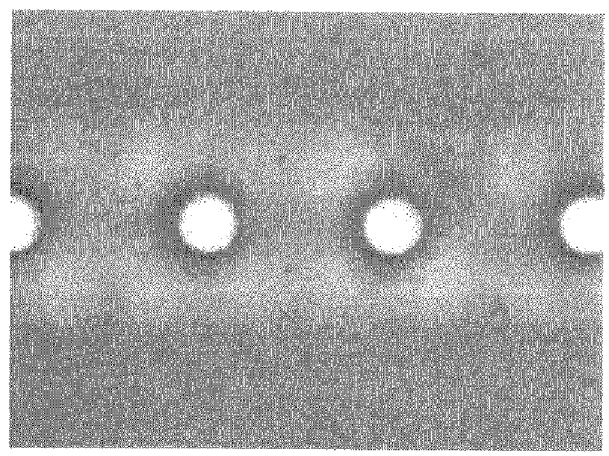

Microphotographs of the surface state of the electrodes 42 thus processed by cutting under the above-described adjustment and management are shown in FIGS. 10A and 10B. FIG. 10A shows a state of FIG. 8C, and FIG. 10B shows a state of FIG. 8D. It is found that the electrodes 42 after the cutting process of the modified example 2 shows no stain of the insulating resin formed on the surface thereof, and that the cutting process was successfully carried out without causing liquefaction of the insulating material.

Figure 9A:
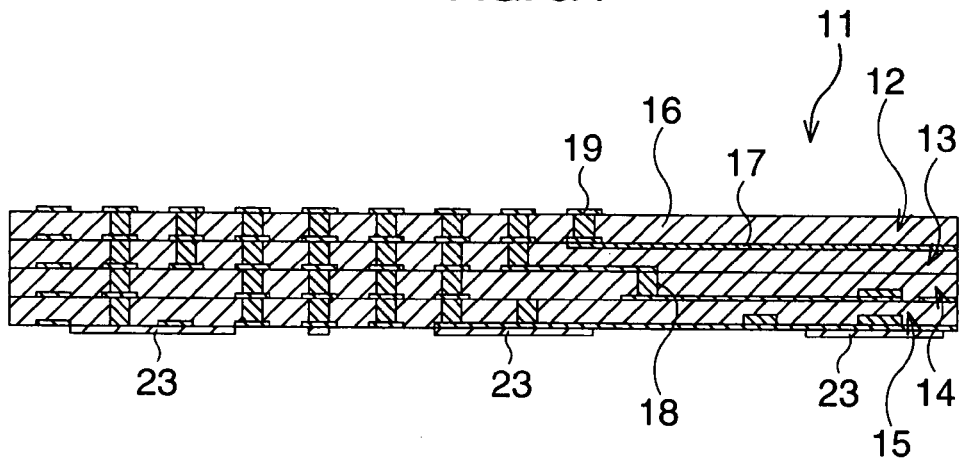
FIGS. 9A to 9C are schematic sectional views sequentially showing process steps of the method of connecting base materials according to the second modified example of the first embodiment, as continued from FIG. 8E.
Figure 9B:
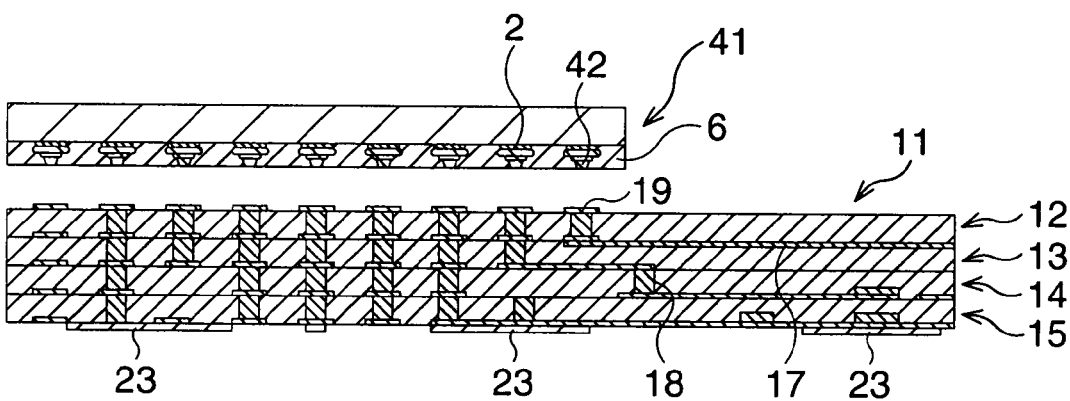
Figure 9C:
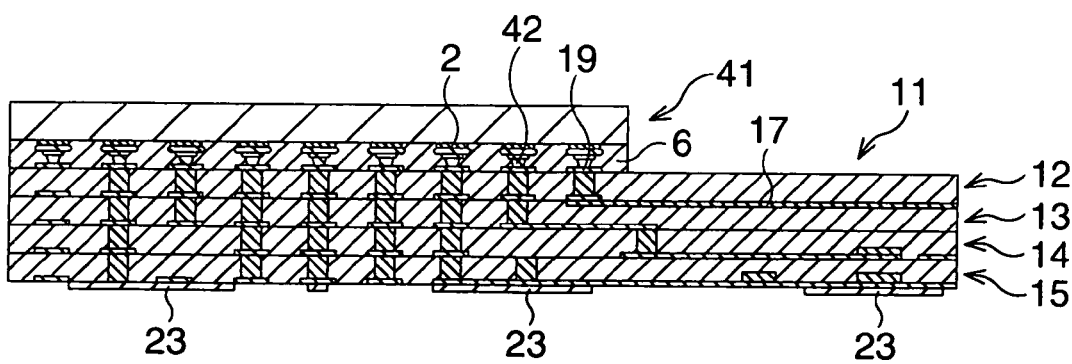

Next, the individual semiconductor chips 41 are diced from the semiconductor substrate 20 (of course this process is unnecessary for the case where the individual semiconductor chips 1 were diced before the cutting process), and as shown in FIG. 9B, the planarized surfaces of each semiconductor chip 41 and the circuit board 11 are opposed. Then as shown in FIG. 9C, the electrodes 42 and the electrodes 19 are opposed and brought into contact, and the insulating film 6 is liquefied while keeping the semiconductor chip 41 and circuit board 11 shown in FIG. 9A at a temperature not lower than 80° C., which is the liquefaction temperature of the insulating film 6 (first temperature), and lower than the solidification (curing) temperature (second temperature) of the insulating film 6, and the insulating film 6 is liquefied so that the insulating resin of the insulating film 6 fills the space between the electrodes 42 and electrodes 19. An ultrasonic vibration of approximately 10 gf per one electrode is then applied typically at 150° C., and the semiconductor chip 41 is pressurized for a predetermined time period. Further keeping of the work at 150° C. for 30 minutes or around completely makes the insulating resin cure, and produces a solid phase diffusion layer between the electrodes 42 and electrodes 19, thereby the inter-metal bonding is stabilized. This is successful in connecting the semiconductor chip 41 and the circuit board 11 with the aid of the insulating film 6, and through inter-metal bonding ascribable to the solid phase diffusion layer formed between the electrodes 42, 19. In this process, the electrodes 42, 19 are bonded to thereby establish electrical connection, and the insulating film 6 contributes to a tight bonding by virtue of its excellent adhesiveness, and this ensures the connection between the semiconductor chip 41 and the circuit board 11.

Thereafter, solder balls 30 used for external connection are placed on the connection terminals 23 formed on the other main surface of the circuit board 11, thereby the semiconductor device is completed.

Second Embodiment

The paragraphs below will explain a second embodiment of the present invention. The second embodiment differs from the first embodiment in state of the electrodes on the circuit board. It is to be noted that the same reference numerals will commonly be used for the constituents equivalent to those shown in the first embodiment.

FIGS. 11A to 11E are schematic sectional views sequentially showing essential process steps of the method of connecting base materials according to the second embodiment.

First, the process steps shown in FIGS. 1A to 1D are carried out similarly to as described in the first embodiment, to thereby fabricate the semiconductor chip 1 having the surfaces of the electrodes 5 and insulating film 6 continuously made flat, as shown in FIG. 1E.

Figure 11A:
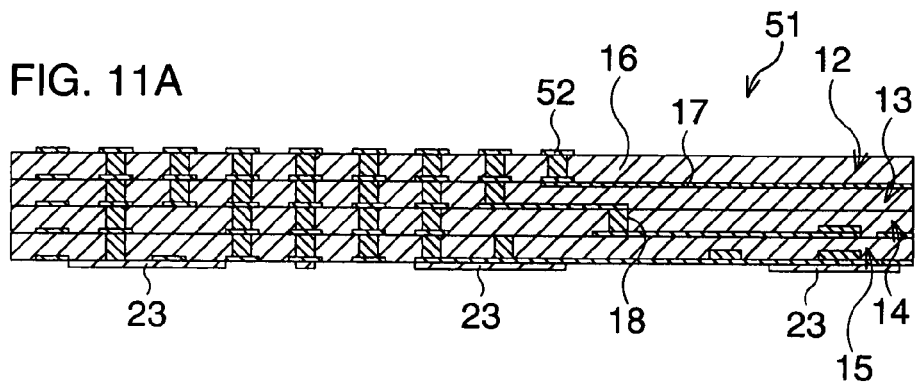
FIGS. 11A to 11E are schematic sectional views sequentially showing process steps of the method of connecting base materials according to a second embodiment.

On the other hand, a circuit board 51 in this embodiment is a packaged board having a plurality of, four in this drawing, wiring layers 12, 13, 14 and 15 stacked therein as shown in FIG. 11A, and each of the individual wiring layers 12 to 15 respectively has an insulating film 16 having wirings 17 and viaholes 18 used for inter-wiring connection formed therein. A plurality of electrodes 52 are formed on one main surface of the circuit board 51, that is, on the surface of the topmost wiring layer 12, and a plurality of connection terminals 23 connected to with the viaholes 18 are formed on the other main surface the circuit board 51, that is, on the surface of the lowermost wiring layer 15. The electrodes 52 are typically composed of any one of Au, Sn, Cu and solder.

Figure 11B:
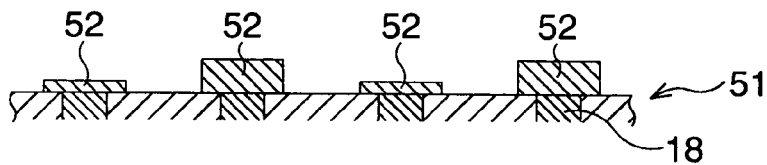

The plurality of electrodes 52 herein are formed with non-uniform height as shown in FIG. 11B.

Figure 11C:
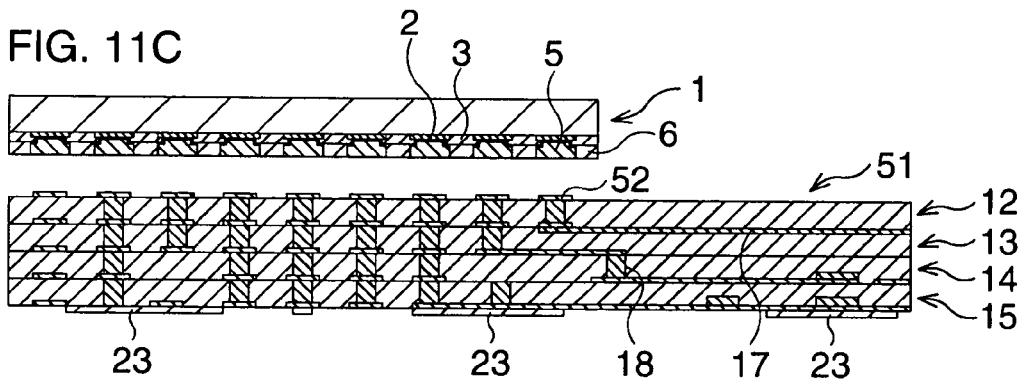
Figure 11D:
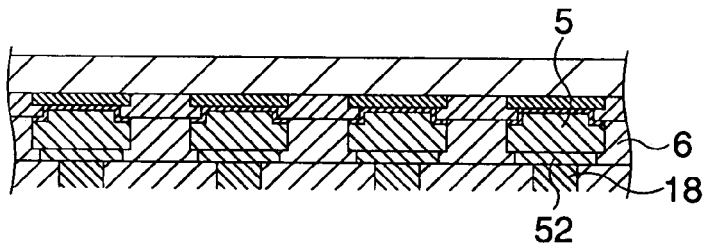
Figure 11E:
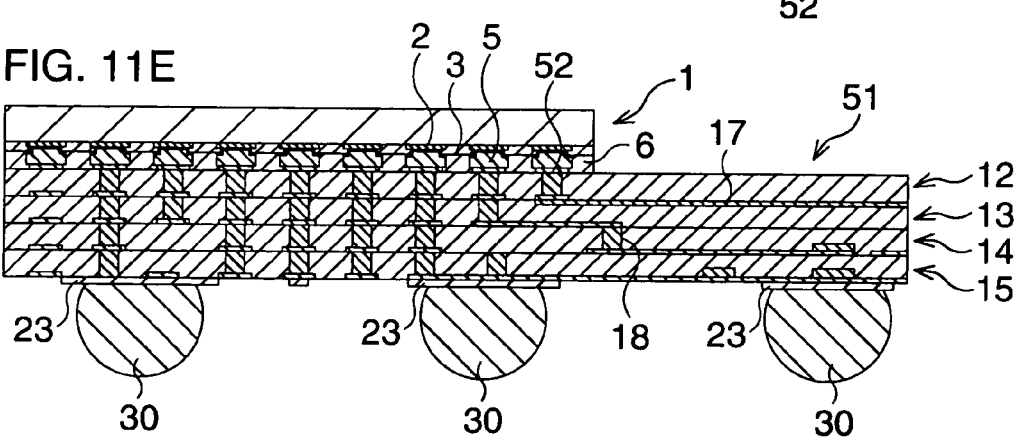

Next, the individual semiconductor chips 1 are diced from the semiconductor substrate 20 (of course this process is unnecessary for the case where the individual semiconductor chips 1 were diced before the cutting process), and as shown in FIG. 11C, each semiconductor chip 1 and the circuit board 11 are opposed while aligning the electrodes 5, 52. Then as shown in FIG. 1D, the electrodes 5 and the electrodes 52 are opposed and brought into contact, and the electrodes 5 and the electrodes 52 are allowed to cause plastic deformation under a load of 10 gf per one electrode, while keeping the semiconductor chip 1 and circuit board 51 at a temperature not lower than 80° C., which is the liquefaction temperature of the insulating film 6 (first temperature), and lower than the solidification (curing) temperature (second temperature) of the insulating film 6. This successfully eliminates height difference (step) of the individual electrodes 52 as shown in FIG. 11E. In this process, the insulating film 6 is liquefied so that the insulating resin of the insulating film 6 fills the space between the electrodes 5 and electrodes 52. The insulating resin is then allowed to cure at a temperature not lower than the second temperature, which is 150° C. herein for example, while being pressed under a load of 10 gf per electrode. Further keeping of the work at 150° C. for 30 minutes or around completely makes the insulating resin cure, and produces a solid phase diffusion layer between Au contained in the electrodes 5 and Sn contained in the electrodes 52, thereby the inter-metal bonding is stabilized. This is successful in connecting the semiconductor chip 1 and the circuit board 51 with the aid of the insulating film 6, and through inter-metal bonding ascribable to the solid phase diffusion layer formed between the electrodes 5, 52. In this process, the electrodes 5, 52 are bonded to thereby establish electrical connection, and the insulating film 6 contributes to a tight bonding by virtue of its excellent adhesiveness, and this ensures the connection between the semiconductor chip 1 and the circuit board 51.

Thereafter, solder balls 30 used for external connection are placed on the connection terminals 23 formed on the other main surface of the circuit board 51, thereby the semiconductor device is completed.

Also in this embodiment, it is allowable to use the semiconductor chip 31 having the electrodes 32 composed of solder bumps, or to use the semiconductor chip 41 having the electrodes 42 composed of Au stud bumps, similarly to as described in the modified examples 1 and 2.

(Experimental Cases Regarding the Present Invention)

The next paragraphs will describe various experiments carried out in conjunction with the present invention.

(Experimental Case 1)

In fabrication of the semiconductor device having the electrodes 32 composed of solder bumps as described in modified example 1 of the first embodiment, connection state between the semiconductor chip and the circuit board was investigated based on comparison with a comparative example in which the cutting process was not carried out.

In experimental case 1 herein, the semiconductor chip having the adhesive insulating material specified by the invention and projected electrodes composed of a solder (solder bumps) was bonded to the electrodes (copper plated with nickel and gold) of the circuit board by ultrasonic bonding. Conditions listed below were commonly applied for both of those planarized by the cutting process (present invention) and those not processed by the cutting (comparative example):

1. load: 10 gf per one electrode;
2. ultrasonic vibration time: 5 seconds;
3. temperature of the circuit board: 140° C.;
4. temperature of the semiconductor chip: room temperature; and
5. optimum final solidification conditions for the insulating resin: 150° C. for 30 minutes.

FIGS. 12A and 12B are microphotographs showing results of the fabrication according to experimental case 1, wherein FIG. 12A shows the present invention, and FIG. 12B shows comparative example. In each of FIGS. 12A and 12B, the upper photograph shows a view in the vicinity of the bonded electrodes, and the lower photograph shows a view in the vicinity of the bonding interface between both electrodes.

It is found from FIGS. 12A and 12B that the present invention clearly shows a clear formation of a uniform alloyed layer by virtue of solid phase diffusion between both electrodes, whereas the comparative example shows a gap between the electrodes due to poor formation of the alloy. The comparative example was also found to fail in producing a satisfactory amount of alloy under any conditions even after investigations into every kind of condition, and was rationally considered as inappropriate for the practical use.

(Experimental Case 2)

Superiority of the cutting process using a cutting tool over polishing was investigated.

FIGS. 13A and 13B are microphotographs showing results of the fabrication according to experimental case 2, wherein FIG. 13A shows a result of polishing, and FIG. 13B shows a result of the cutting process. In each of FIGS. 13A and 13B, the top photograph shows a view of the surface of the electrodes immediately after the planarization, the middle photograph shows a view of the electrodes immediately after the bonding, and the bottom photograph shows a view of the electrodes after being kept at 150° C. for 96 hours.

In the polishing process, typically as described in the invention of Patent Document 1, a general procedure is to polish an adhesive insulating material and bumps so as to obtain a single flat surface. The polishing may seem to certainly produce the flat surface similarly to that obtainable by the cutting process, but analysis under an ultra-high magnification reveals that the resultant surface has fine abrasive grains, having a sub-micron grain size, bit therein. These grains are known to interfere uniform diffusion reaction of metals on the metal surface.

In this experiment, each of the gold electrodes planarized by polishing (FIG. 13A) and gold electrodes planarized by cutting (FIG. 13B) was. individually connected to an aluminum film, heated to 150° C., and time-dependent change was observed. The adhesive insulating material is not used in the experiment. It is found that the gold electrodes planarized by polishing causes a gap growing between themselves and the aluminum film after being kept at 150° C. for 96 hours, unlike the gold electrodes planarized by cutting. This means that the abrasive grains used for the polishing and bit in gold electrodes interfere uniform metal diffusion. It is also obvious that water or alcohols used in combination with the abrasive grains adversely affects the adhesive insulating material. To eliminate the adverse effect, it is necessary to slightly remove the polished surface of the insulating material together with the abrasive grains by a chemical procedure, and then remove the water infiltrated into the insulating material by heating. It is obvious from the above that it is not practical to planarize the insulating material and metal electrodes en bloc by polishing.

On the contrary, planarization by the cutting process using no abrasive grains nor lubricant is a practically feasible method, because it can produce a clean cut surface, and completely free from any inhibitory factors such as interfering the inter-metal diffusion and degrading the adhesiveness of the insulating material.

As has been described in the above, the embodiments of the present invention and the individual modified examples thereof are successful in forming smooth metal terminals with uniform height at low costs without needing any lithographic process, in fully satisfying demands for micronization of semiconductor devices to as fine as several micrometers to several tens of micrometers aiming to high-density mounting, and in providing a highly-reliable semiconductor device allowing low-damage mounting.

The embodiments of the present invention and the individual modified examples thereof exemplified a semiconductor chip as the first base material, and a circuit board as the second base material, wherein of course the present invention is by no means limited thereto. The present invention is also applicable to the case where the semiconductor chip is used also as the second base material, and both semiconductor chip are bonded with each other, or to the case where the circuit board is used also as the first base material, and both circuit boards are bonded with each other.

What is claimed is:

1. A method of connecting base materials comprising the steps of:
    forming an insulating film on a first base material having a plurality of first electrodes formed on the surface thereof, so as to bury said first electrode using an insulating material which exhibits adhesive property at a first temperature or above;
    planarizing the surface of said first electrode and the surface of said insulating film so as to produce a continuous flat surface, by cutting using a cutting tool, while keeping temperature of said insulating film lower than said first temperature; and
    opposing said first base material to a second base material having a plurality of second electrodes formed on the surface thereof so as to bring said first electrodes and said second electrodes into contact to thereby connect said first base material and said second base material via said insulating film, and to thereby produce solid phase diffusion layers of metals between said first electrodes and said second electrodes.

2. The method of connecting base materials according to claim 1, wherein said cutting is carried out while keeping the temperature of said insulating film, possibly elevated due to frictional heat generated during the cutting, lower than said first temperature.

3. The method of connecting base materials according to claim 1, wherein in said step of opposing and connecting said first base material with said second base material,
    connection via said insulating film is effected at the same time with the connection of said first electrode and said second electrode, at a temperature not lower than said first temperature.

4. The method of connecting base materials according to claim 1, wherein said step of opposing and connecting said first base material and said second base material further comprises the steps of;
    setting temperature of said first base material to a temperature lower than said first temperature, and setting temperature of said second base material to a temperature higher than said first temperature; and
    opposing and making contact of said first electrode and said second electrode at thus-set temperature, so as to connect said first base material and said second base material while raising temperature of said insulating film to a temperature not lower than said first temperature.

5. The method of connecting base materials according to claim 1, wherein said insulating material is such as showing no adhesive property in the solid state at normal temperature, and showing the adhesive property if the temperature reaches said first temperature.

6. The method of connecting base materials according to claim 5, wherein said second electrodes on said second base material individually have predetermined heights; and
    in said step of opposing and connecting said first base material and said second base material,
    said first electrodes and said second electrodes are connected, at a temperature not lower than said first temperature, by opposing and making contact of said first electrodes and said second electrodes under a predetermined pressure so as to allow them to cause plastic deformation, and by filling the space between said electrodes with said insulating material being liquefied.

7. The method of connecting base materials according to claim 1, wherein said insulating material loses the adhesive property at a second temperature or above, higher than said first temperature.

8. The method of connecting base materials according to claim 7, wherein said step of opposing and connecting said first base material and said second base material further comprises the steps of:

after said cutting, opposing and making contact of said first electrodes and said second electrodes, and connecting said first base material and said second base material via said insulating film, at a temperature not lower than said first temperature and lower than said second temperature; and allowing said insulating film to solidify and promoting generation of said solid phase diffusion layers, at a temperature not lower than said second temperature.

9. The method of connecting base materials according to claim 1, wherein said first base material is directly subjected to said cutting in a state as being fabricated into a semiconductor substrate.

10. The method of connecting base materials according to claim 1, wherein said cutting is subjected to said first base material as a diced semiconductor chip.

11. The method of connecting base materials according to claim 1, wherein said second base material is a circuit board.

12. The method of connecting base materials according to claim 1, wherein said plurality of electrodes is composed of at least any one of gold, tin, copper, silver aluminum, nickel and alloys of these elements.

* * * * *